(12) United States Patent
Hagihara

(10) Patent No.: US 6,438,831 B1
(45) Date of Patent: Aug. 27, 2002

(54) METHOD OF MANUFACTURING AN INTERCONNECTOR

(75) Inventor: Junichi Hagihara, Sendai (JP)

(73) Assignee: Tokyo Electron Limited, Tokyo (JP)

(*) Notice: Subject to any disclaimer, the term of this patent is extended or adjusted under 35 U.S.C. 154(b) by 0 days.

(21) Appl. No.: 09/557,414

(22) Filed: Apr. 21, 2000

(30) Foreign Application Priority Data

May 28, 1999 (JP) .............................. 11-149246

(51) Int. Cl.$^7$ .................................. H01R 43/00
(52) U.S. Cl. .................. 29/884; 29/825; 29/830; 29/831; 29/832; 29/837; 29/874; 29/876; 29/747; 29/749; 29/755; 29/760; 29/881; 29/883; 156/245; 156/254; 156/297; 156/298; 264/138; 264/255; 439/65; 439/66; 439/74; 439/86; 439/91
(58) Field of Search .................. 29/825, 830, 831, 29/832, 837, 874, 876, 884, 747, 749, 755, 760, 881, 883; 156/254, 297, 298, 245; 439/65, 66, 74, 86, 91; 264/138, 255

(56) References Cited

U.S. PATENT DOCUMENTS

| | | | | |
|---|---|---|---|---|
| 4,705,336 A | * | 11/1987 | Bonhomme | 439/597 |
| 4,920,636 A | * | 5/1990 | Eck | 29/747 |
| 4,927,368 A | * | 5/1990 | Shino | 439/66 |
| 5,153,818 A | * | 10/1992 | Mukougawa | 361/395 |
| 5,442,852 A | * | 8/1995 | Danner | 29/843 |
| 5,509,203 A | * | 4/1996 | Yamashita | 29/879 |
| 5,511,994 A | * | 4/1996 | Minich | 439/620 |
| 5,531,022 A | * | 7/1996 | Beaman | 29/850 |
| 5,800,184 A | * | 9/1998 | Lopergolo | 439/66 |
| 5,810,607 A | * | 9/1998 | Shih | 439/66 |
| 5,819,410 A | * | 10/1998 | Furusawa | 29/883 |
| 6,000,126 A | * | 12/1999 | Pai | 29/840 |
| 6,024,579 A | * | 2/2000 | Bennet | 439/66 |
| 6,045,367 A | * | 4/2000 | Maldonado | 439/66 |
| 6,079,987 A | * | 6/2000 | Matsunaga | 439/66 |
| 6,174,172 B1 | * | 1/2001 | Kazama | 439/66 |

FOREIGN PATENT DOCUMENTS

| | | |
|---|---|---|
| JP | 54-57698 | 5/1979 |
| JP | 55-111014 | 8/1980 |
| JP | 59-52487 | 12/1984 |

* cited by examiner

*Primary Examiner*—Peter Vo
*Assistant Examiner*—Paul Kim
(74) *Attorney, Agent, or Firm*—Oblon, Spivak, McClelland, Maier & Neustadt, P.C.

(57) ABSTRACT

A method of manufacturing an interconnector that is interposed between a pair of terminal plates each having electrodes arranged in a predetermined pattern, for electrically connecting the electrodes of the terminal plates, including arranging positioning plates in a container and inserting conductive wires into through holes of the positioning plates. Then forming a stacked body by alternately forming stacked insulating sheet layers and synthetic resin layers, in the container and thereafter cutting the stacked body at a middle portion of each synthetic resin layer before separating the synthetic resin layers from the insulating sheet layers, thereby forming interconnectors.

10 Claims, 2 Drawing Sheets

METHOD OF MANUFACTURING AN INTERCONNECTOR

CROSS-REFERENCE TO RELATED APPLICATIONS

This application is based upon and claims the benefit of priority from the prior Japanese Patent Application No. 11-149246, filed May 28, 1999, the entire contents of which are incorporated herein by reference.

BACKGROUND OF THE INVENTION

This invention relates to an interconnector interposed between two terminal plates each having a plurality of electrodes (electrode groups), for electrically connecting them.

An anisotropic conductivity sheet is well known as an example of an interconnector of this type. The anisotropic conductivity sheet has an insulating sheet in which conductive fine particles, for example, are dispersed. If a compressing force is applied to the sheet in a direction perpendicular to the surface of the sheet (i.e. in the thickness direction of the sheet), the conductive fine particles are brought into contact with each other, thereby enabling electrical connection only in the thickness direction. However, when such a compressing force is repeatedly applied to the anisotropic conductivity sheet to thereby execute electric connection, the elasticity of the sheet will be lost due to, for example, material fatigue. As a result, the life of the sheet will be reduced.

On the other hand, Japanese Patent Application KOKAI Publication No. 55-111014 proposes an anisotropic conductivity sheet using conductive wires. In this anisotropic conductivity sheet, a great number of conductive wires are arranged substantially perpendicular to the surface of an insulating rubber sheet so that they extend through the sheet. The conductive wires are contained in the rubber sheet in a warped state. When manufacturing this anisotropic conductivity sheet, first, the conductive wires are distributed in a liquid rubber. Then, the conductive wires are aligned in the thickness direction of the sheet using a magnetic field, and a compressing force is applied to the rubber in a direction perpendicular to the surface of a to-be-formed sheet to thereby warp the conductive wires. In this state, the liquid rubber is hardened in the shape of a sheet.

In the anisotropic conductivity sheet of Japanese Patent Application KOKAI Publication No. 55-111014, the compressing force is applied from the electrodes to the conductive wires. This means that a short life due to repeated application of a compressing force can be avoided. In this sheet, however, the conductive wires distributed in the liquid rubber must be arranged in the thickness direction of a to-be-formed sheet. Therefore, the conductive wires cannot be arranged into a desired pattern, and further a plurality of sheets cannot be manufactured simultaneously. This inevitably results in a low efficiency of production.

BRIEF SUMMARY OF THE INVENTION

The present invention has been developed to solve the above-mentioned problems.

It is an object of the invention to provide an interconnector capable of arranging a plurality of connecting terminals in accordance with the arrangement of electrodes incorporated in a to-be-connected object, and a method of manufacturing the interconnector.

It is another object of the invention to provide an interconnector which can be manufactured at highly efficiently, and a method of manufacturing the interconnector.

It is yet another object of the invention to provide a highly durable interconnector, and a method of manufacturing the interconnector.

According to a first aspect of the invention, there is provided an interconnector, to be interposed between a pair of terminal plates each having a plurality of electrodes arranged in a predetermined arrangement pattern, for electrically connecting corresponding electrodes of the terminal plates, comprising:

an insulating sheet; and a plurality of connecting terminals, wherein the connecting terminals each extend through the insulating sheet, each have opposite ends thereof projecting from respective opposite surfaces of the insulating sheet, are arranged in accordance with the predetermined arrangement pattern of the plurality of electrodes, and are fixed as one body in the insulating sheet.

In this interconnector, it is preferable that the insulating sheet is made of silicone rubber.

In this interconnector, it is also preferable that the connecting terminals are elastically deformable.

According to a second aspect of the invention, there is provided a method of manufacturing an interconnector to be interposed between a pair of terminal plates each having a plurality of electrodes arranged in a predetermined arrangement pattern, for electrically connecting corresponding electrodes of the terminal plates, comprising the steps of:

arranging, in a container, two positioning plates that have a plurality of through holes arranged in a pattern corresponding to the predetermined arrangement pattern of the plurality of electrodes, the two positioning plates being separated from each other;

inserting conductive wires into the respective through holes of the two positioning plates;

alternately stacking, in the container, a plurality of insulating sheet layers and a plurality of separable synthetic resin layers, thereby forming a stacked body, the conductive wires being formed integral with each of the insulating sheet layers as one body;

separating the stacked body from the container;

cutting the stacked body at a predetermined portion of each of the synthetic resin layers in parallel with the insulating sheet layers; and separating the cut synthetic resin layers from the insulating sheet layers.

In this method, it is preferable that the insulating sheet layers are made of silicone rubber.

It is also preferable that the method further comprises the step of positioning the two positioning plates such that the through holes of one of the positioning plates are aligned with the through holes of the other of the positioning plates, the positioning step being executed before the step of inserting the conductive wires (12A) into the respective through holes of the two positioning plates.

In the method, it is further preferable that in the step of forming the stacked body, lowermost and uppermost layers of the stacked body are formed of synthetic resin layers.

In the method, it is preferable that in the step of positioning the two positioning plates, the two positioning plates are positioned using at least one guide hole formed in each of the positioning plates.

In the method, it is yet further preferable that in the step of positioning the two positioning plates, the two positioning plates are positioned by placing the positioning plates close to each other in the container.

According to a third aspect of the invention, there is provided a method of manufacturing an interconnector to be interposed between a pair of terminal plates each having a plurality of electrodes arranged in a predetermined pattern, for electrically connecting corresponding electrodes of the terminal plates, comprising the steps of:

arranging, in a container, two positioning plates that have a plurality of through holes arranged in a pattern corresponding to the predetermined arrangement pattern of the plurality of electrodes, the two positioning plates being separated from each other;

inserting conductive wires into the respective through holes of the two positioning plates;

forming, in the container, at least one stacked body consisting of an insulating sheet layer and a separable synthetic resin layer, the conductive wires being formed integral with the insulating sheet layer as one body;

separating the stacked body from the container; and separating the synthetic resin layer from the insulating sheet layer.

It is preferable that the method further comprises the step of cutting, into a predetermined length, those portions of the conductive wires, which project from the insulating sheet layer into the synthetic resin layer, the cutting step being executed before the step of separating the synthetic resin layer from the insulating sheet layer.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

The invention will be described with reference to the embodiments shown in FIGS. 1–7B.

Figure 1:
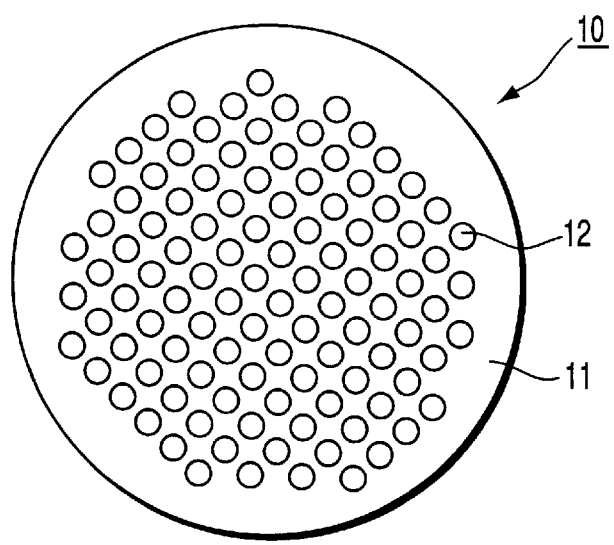
FIG. 1 is a plan view showing an interconnector according to an embodiment of the invention.
Figure 2:
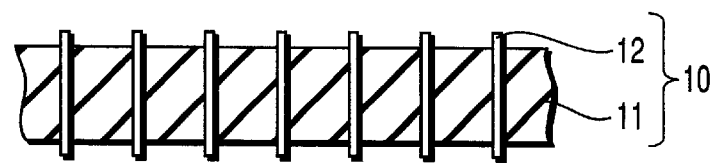
FIG. 2 is an enlarged sectional view showing the interconnector of FIG. 1.

An interconnector according to the embodiment of the invention is interposed between a pair of terminal plates each having a group of electrodes arranged in a predetermined pattern, thereby electrically connecting the electrodes of the terminal plates. As is shown in FIGS. 1 and 2, an interconnector 10 has an insulating sheet 11, and a plurality of connecting terminals 12 which extend through the insulating sheet 11, are formed integral with the sheet and are arranged in a predetermined pattern over substantially the entire surface of the sheet. The upper and lower ends of each connecting terminal 12 project from the upper and lower surfaces of the insulating sheet 11, respectively. When the projecting connecting terminals 12 have been brought into contact with the electrode groups of both terminal plates as described later, the electrode groups of the terminal plates are reliably electrically connected to each other. The arrangement pattern of the connecting terminals 12 can be optionally set in accordance with the arrangement pattern of the electrode group of each terminal plate by selecting a positioning plate.

The material of the insulating sheet 11 is not particularly limited. It suffices if the material is an insulating material. It is preferable that the insulating sheet 11 is formed of an elastic synthetic resin such as silicone rubber. The material of the connecting terminal 12 is not particularly limited. It suffices if the material is a conductive metal, preferably an elastic conductive metal (for example, tungsten, nickel, an alloy of these metals, etc.). Further, the connecting terminal 12 may be formed of a conductive metal coated with an elastic metal (e.g. an alloy of nickel and gold or copper). When necessary, the connecting terminal 12 may be coated with a highly conductive metal such as gold or with a highly conductive alloy.

Referring then to FIGS. 4A–7B, a method for manufacturing an interconnector according to the embodiment of the invention will be described. The embodiment uses a cylindrical container 21 having an opening of the same diameter as the interconnector 10, conductive wires 12A, a pair of positioning plates 22 for positioning the conductive wires 12A into a predetermined pattern, a liquid rubber (for example, silicone rubber, urethane rubber, etc.) and a liquid synthetic resin (for example, polymethyl methacrylate). The positioning plates 22 has the same diameter as the interconnector 10, and has a plurality of through holes 22A arranged in a pattern according to the arrangement pattern of the electrode groups of to-be-connected objects. The thickness of the positioning plates 22 can be set to any desired value. For example, if the thickness is set at substantially the same value as the length of each projecting portion of each connecting terminal 12, the projecting portions can be easily formed by removing the positioning plates 22, as will be described later. The container 21 can include means (not shown) for positioning the upper and lower positioning plates in a θ-direction and/or graduations (not shown) for monitoring the amount of resin in the container 21. Further, the container 21 is preferably transparent so that the amount of resin therein can be monitored.

Figure 4A:
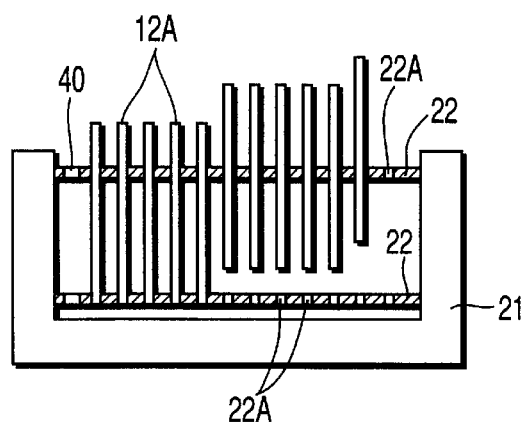
FIGS. 4A and 4B are sectional views useful in explaining the initial stage of a process for manufacturing the interconnector of the invention.

The process for manufacturing the interconnector 10 according to the embodiment will now be described. First, as shown in FIG. 4A, one of the positioning plates 22 is placed on the bottom of the container 21. The other positioning plate 22 is placed above the already placed plate 22 in parallel thereto. At this time, the through holes 22A of the upper and lower positioning plates 22 are aligned vertically. The distance between the two positioning plates 22 can be set at a desired value in accordance with the number of interconnectors 10 to be manufactured.

Subsequently, the conductive wires 12A are inserted into the through holes 22A of the upper and lower positioning plates 22 as shown in FIG. 4A. It is preferable that the conductive wires have the same size. However, some variations in size are allowable. The conductive wires 12A are arranged vertical in the container 21.

Figure 4B:
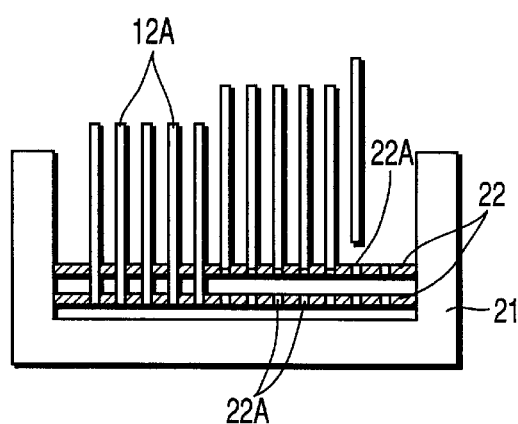

In the process show in FIG. 4A, two positioning plates are located in the container 21 with a certain space interposed therebetween. In this process, it is necessary to align the through holes 22A of the two positioning plates. This positioning can be executed by a mechanical positioning method or an optical positioning method. For example, positioning can be executed using a guide hole 40 formed in each positioning plate 22. There is another positioning method as shown in FIG. 4B, in which the two positioning plates 22 are arranged close to each other or in contact with each other, and are positioned using the through holes 22A or the guide holes 40.

Figure 5:
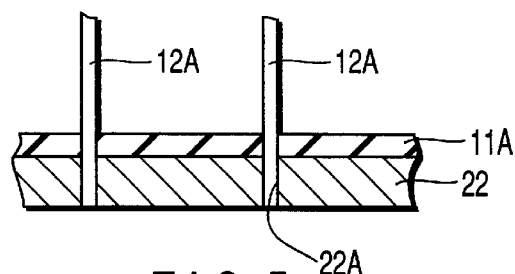
FIG. 5 is a sectional view of an enlarged essential part, useful in explaining a process subsequent to the process of FIGS. 4A and 4B.
Figure 6:
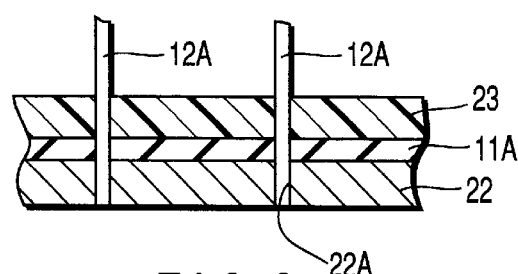
FIG. 6 is a sectional view of an enlarged essential part, useful in explaining a process subsequent to the process of FIG. 5.

After the two positioning plates are arranged in the container with a predetermined space therebetween, liquid silicone rubber is supplied into the container 21 through an inlet (not shown) and then hardened, thereby forming an insulating sheet layer 11A made of silicone rubber and shown in FIG. 5. The thickness of the insulating sheet layer 11A is set at, for example, 1 mm. After the insulating sheet layer 11A is formed, a liquid synthetic resin of a predetermined amount is supplied and then hardened, thereby forming a synthetic resin layer 23 as shown in FIG. 6. The thickness of the synthetic resin layer 23 is determined on the basis of, for example, a size twice the size of the projecting portion of each connecting terminal 12. Subsequently, liquid silicone rubber and the liquid synthetic resin are alternately and repeatedly supplied into the container 21, whereby insulating sheet layers 11A and synthetic resin layers 23 are alternately formed. The uppermost layer is formed of an insulating sheet layer 11A.

After the insulating sheet layers 11A and the synthetic resin layers 23 are hardened, the positioning plates 22, the insulating sheet layers 11A, the synthetic resin layers 23 and the conductive wires 12A are formed integral in the shape of a cylindrical resin block in the container 21. When this resin block is separated from the container 21, it has a cross section of a striped pattern formed of the insulating sheet layers 11A and the synthetic resin layers 23, as is shown in FIGS. 7A and 7B.

Figure 7A:
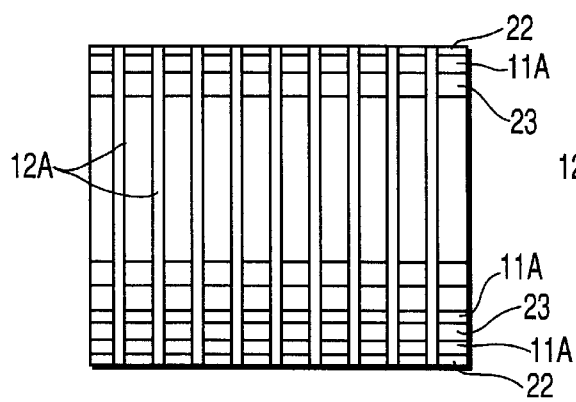
FIGS. 7A and 7B are sectional views illustrating products each formed as one body and separated from a container shown in FIG. 4A or 4B.
Figure 7B:
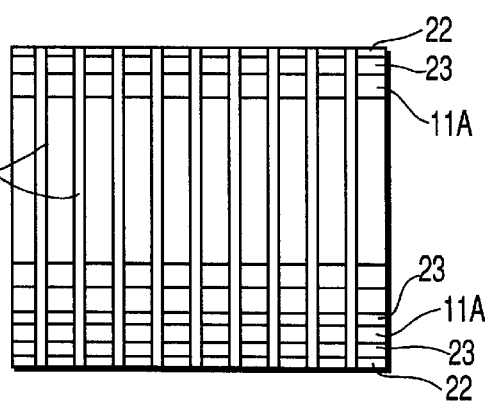

FIG. 7A shows a structure in which the lowermost and uppermost layers of the resin block are formed of insulating sheet layers, while FIG. 7B shows a structure in which the lowermost and uppermost layers of the resin block are formed of the synthetic resin layers. As in the cases of FIGS. 7A and 7B, the lowermost and uppermost layers of the resin block may be formed of the same material. Alternatively, the lowermost and uppermost layers of the resin block may be formed of different materials.

After that, the synthetic resin layers 23 are sequentially cut at middle portions of their thicknesses, whereby a circular plate of a three-layer structure consisting of two synthetic resin layers 23 and an insulating sheet layer 11A interposed between the layers 23. The interconnector 10 shown in FIGS. 1 and 2, in which the connecting terminals 12 project from the opposite surfaces of the insulating sheet layer 11A, is formed by separating the synthetic resin layers 23 from the insulating sheet layer 11A. Each of the circular plates obtained from the opposite ends of the resin block has one of the positioning plates 22 at one side thereof. In each of these circular plates, projecting portions of the connecting terminals 12 can be made to have the same length when the positioning plate 22 and the synthetic resin layer 23 are removed, by making the plate 22 have the same thickness as the synthetic resin layer 23 provided on the opposite surface of the insulating sheet layer 11A.

Figure 3:
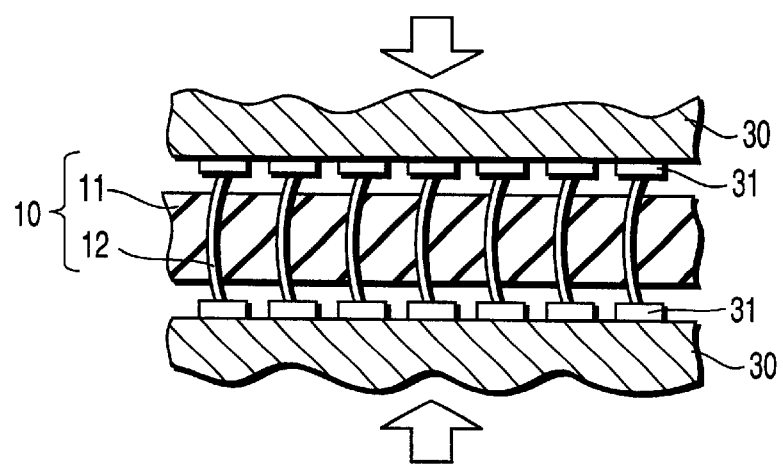
FIG. 3 is a sectional view of an essential part, illustrating a state in which the electrode groups of terminal plates are electrically connected using the interconnector of FIG. 1.

Using the above-described interconnector 10, two terminal plates 30 having groups 31 of electrodes arranged in a predetermined pattern can be electrically connected to each other. Specifically, as shown in FIG. 3, the interconnector 10 is interposed between the pair of terminal plates 30. In this state, a compressing force is applied to the interconnector 10 via the terminal plates 30 as indicated by the arrows in the FIG. 3. The electrodes of the electrode groups 31 of the terminal plates 30 are brought into contact with the opposite ends of the connecting terminals 12 projecting from the insulating sheet 11 as shown in the FIG. 3. Then, the compressing force causes each connecting terminal 12 of the interconnector 10 to be bent in the insulating sheet 11 and to be kept in elastic contact with a corresponding electrode of the electrode groups 31. As a result, the electrode groups 31 of the pair of the terminal plates 30 are reliably electrically connected.

As described above, in the embodiment, the conductive wires 12A are arranged into a predetermined pattern in the container 21, and then insulating sheet layers 11A and synthetic resin layers 23, which are separable from each other, are alternately stacked on each other. A resin block consisting of the conductive wires 12A, the insulating sheet layers 11A and the synthetic resin layers 23, which are formed integral as one body, is separated from the container 21. Subsequently, each synthetic resin layer 23 of the resin block may be cut at its middle portion, thereby carving out circular plates. After that, the synthetic resin layers 23 are separated from the insulating sheet layers 11A, thereby producing, at a high efficiency, a plurality of interconnectors having the connecting terminals 12 arranged into a pattern corresponding to the arrangement of the to-be-connected electrode groups 31.

Further, the interconnector 10, in which elastically deformable connecting terminals 12 project from the opposite surfaces of the insulating sheet 11, can reliably connect each of the terminals 12 to a corresponding one of the electrodes of the electrode group 31 of each terminal plate 30. Furthermore, since the elastically deformable connecting terminals 12 receive a compressing force applied from each electrode group 31 to the interconnector, the initial connection performance is maintained even when the compressing force is repeatedly applied. Thus, the interconnector 10 has a high durability.

Accordingly, the interconnector 10 of the embodiment can be suitably used as, for example, an interposer between the contactors of an inspecting apparatus for, for example, a semiconductor wafer and a main board.

Moreover, if the pitch of the arrangement pattern of the through holes 22A in the positioning plate 22 is narrowed, a demand for narrowing the pitch of the connecting terminals 12 can be satisfied.

The present invention is not limited to the above-described embodiment, but each structural element thereof can be modified as circumstances demand.

According to the invention specified in the claims of the present application, an interconnector that has connecting terminals arranged in a pattern corresponding to the arrangement of to-be-connected electrodes can be manufactured accurately and efficiently. In addition, the invention can provide a highly durable interconnector and a method of manufacturing it.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing an interconnector to be interposed between a pair of terminal plates each having a plurality of electrodes arranged in a predetermined arrangement pattern, for electrically connecting corresponding electrodes of the terminal plates, comprising the steps of:

arranging, in a container, two positioning plates that have a plurality of through holes arranged in a pattern corresponding to the predetermined arrangement pattern of the plurality of electrodes, the two positioning plates being separated from each other;

inserting conductive wires into the respective through holes of the two positioning plates;

forming, in the container, a stacked body in which a plurality of insulating sheet layers and a plurality of separable synthetic resin layers are alternately stacked and the conductive wires are formed integral with each of the insulating sheet layers by alternately repeating a step of supplying and solidifying material for forming each of the plurality of insulating sheet layers and a step of supplying and solidifying material for forming each of the plurality of separable synthetic layers;

separating the stacked body from the container;

cutting the stacked body at a predetermined portion of each of the synthetic resin layers in parallel with the insulating sheet layers; and separating the cut synthetic resin layers from the insulating sheet layers.

2. The method of manufacturing an interconnector according to claim 1, wherein the insulating sheet layers are made of silicone rubber.

3. The method of manufacturing an interconnector according to claim 1, further comprising the step of positioning the two positioning plates such that the through holes of one of the positioning plates are aligned with the through holes of the other of the positioning plates, the positioning step being executed before the step of inserting the conductive wires into the respective through holes of the two positioning plates.

4. The method of manufacturing an interconnector according to claim 3, wherein in the step of positioning the two positioning plates, the two positioning plates are positioned using at least one guide hole formed in each of the positioning plates.

5. The method of manufacturing an interconnector according to claim 3, wherein in the step of positioning the two positioning plates, the two positioning plates are positioned by placing the positioning plates close to each other in the container.

6. The method of manufacturing an interconnector according to claim 1, wherein in the step of forming the stacked body, lowermost and uppermost layers of the stacked body are formed of synthetic resin layers.

7. A method of manufacturing an interconnector to be interposed between a pair of terminal plates each having a plurality of electrodes arranged in a predetermined arrangement pattern, for electrically connecting corresponding electrodes of the terminal plates, comprising the steps of:

arranging, in a container, two positioning plates that have a plurality of through holes arranged in a pattern corresponding to the predetermined arrangement pattern of the plurality of electrodes, the two positioning plates being separated from each other;

inserting conductive wires into the respective through holes of the two positioning plates;

forming, in the container, one stacked body in which at least two insulating sheet layers and at least two seperable synthetic resin layers are alternatively stacked, the conductive wires being formed integral with the insulating sheet layer by alternately repeating a step of supplying and solidifying material for forming each of the plurality of insulating sheet layers and a step of supplying and solidifying material for forming each of the plurality of separable synthetic layers;

separating the stacked body from the container and the positioning plates; and separating the synthetic resin layer from the insulating sheet layer.

8. The method of manufacturing an interconnector according to claim 7, further comprising the step of cutting, into a predetermined length, those portions of the conductive wires, which project from the insulating sheet layer into the synthetic resin layer, the cutting step being executed before the step of separating the synthetic resin layer from the insulating sheet layer.

9. A method of manufacturing an interconnector to be interposed between a pair of terminal plates each having a plurality of electrodes arranged in a predetermined arrangement pattern, for electrically connecting corresponding electrodes of the terminal plates comprising the steps of:

arranging, in a container, two positioning plates that have a plurality of through holes arranged in a pattern corresponding to the predetermined arrangement pattern of the plurality of electrodes, the two positioning plates being separated from each other;

inserting conductive wires into the respective through holes of the two positioning plates;

forming, in the container, a stacked body in which a plurality of insulating sheet layers and a plurality of separable synthetic resin layers are alternately stacked and the conductive wires are formed integral with each of the insulating sheet layers by alternately repeating a step of supplying and solidifying material for forming each of the plurality of insulating sheet layers and a step of supplying and solidifying material for forming each of the plurality of separable synthetic layers.

10. A method of manufacturing an interconnector to be interposed between a pair of terminal plates each having a plurality of electrodes arranged m a predetermined arrangement pattern, for electrically connecting corresponding electrodes of the terminal plates, comprising the steps of:

arranging, in a container, two positioning plates that have a plurality of through holes arranged in a pattern corresponding to the predetermined arrangement pattern of the plurality of electrodes, the two positioning plates being separated from each other;

inserting conductive wires into the respective through holes of the two positioning plates;

forming, in the container, a stacked body in which a plurality of insulating sheet layers and a plurality of separable synthetic resin layers are alternately stacked and the conductive wires are formed integral with each of the insulating sheet layers by alternately repeating a step of supplying and solidifying material for forming each of the plurality of insulating sheet layers and a step of supplying and solidifying material for forming each of the plurality of separable synthetic layers;

separating the stacked body from the container, cutting the stacked body at a predetermined portion of each of the synthetic resin layers in parallel with the insulating sheet layers.

* * * * *